(12) United States Patent
Yang et al.

(10) Patent No.: US 9,112,161 B2
(45) Date of Patent: Aug. 18, 2015

(54) HYBRID LAYER INCLUDING OXIDE LAYER OR ORGANIC LAYER AND ORGANIC POLYMER LAYER AND MANUFACTURING METHOD THEREOF

(75) Inventors: Hoi Chang Yang, Incheon Metropolitan (KR); Mi Jang, Chungcheonbuk-do (KR)

(73) Assignee: INHA-INDUSTRY PARTNERSHIP INSTITUTE, Inchean Metropolitan (KR)

( * ) Notice: Subject to any disclaimer, the term of this patent is extended or adjusted under 35 U.S.C. 154(b) by 171 days.

(21) Appl. No.: 13/499,279

(22) PCT Filed: Feb. 8, 2012

(86) PCT No.: PCT/KR2012/000920
§ 371 (c)(1),
(2), (4) Date: Mar. 29, 2012

(87) PCT Pub. No.: WO2012/134052
PCT Pub. Date: Oct. 4, 2012

(65) Prior Publication Data
US 2012/0248425 A1 Oct. 4, 2012

(30) Foreign Application Priority Data

Mar. 29, 2011 (KR) .................. 10-2011-0028454
Jan. 10, 2012 (KR) .................. 10-2012-0002902

(51) Int. Cl.
*H01L 51/05* (2006.01)
*H01L 51/00* (2006.01)

(52) U.S. Cl.
CPC ........ *H01L 51/0533* (2013.01); *H01L 51/0529* (2013.01); *C08G 2261/3223* (2013.01); *C08G 2261/92* (2013.01); *H01L 51/0053* (2013.01); *H01L 51/0094* (2013.01);
(Continued)

(58) Field of Classification Search
CPC ... H01L 51/10; H01L 51/0545; H01L 51/052; H01L 21/02568; H01L 51/0043; H01L 51/5296; Y02E 10/549
USPC ......................................................... 257/40
See application file for complete search history.

(56) References Cited

U.S. PATENT DOCUMENTS 5,229,172 A 7/1993 Cahalan et al.
5,274,028 A 12/1993 Bertrand et al.
(Continued)

FOREIGN PATENT DOCUMENTS

JP 11-263819 9/1999

OTHER PUBLICATIONS http://www.ncbi.nlm.nih.gov/pubmed/24352569.*
(Continued)

*Primary Examiner* — Thomas L Dickey
*Assistant Examiner* — Gustavo Ramallo
(74) *Attorney, Agent, or Firm* — H.C. Park & Associates, PLC

(57) ABSTRACT

The present invention relates to a hybrid layer including an oxide layer or organic layer, and organic polymer layer, an insulating layer including the hybrid layer, and an electronic device such as an organic field-effect transistor. A hybrid layer according to the present invention may include an oxide layer or an organic layer, and an organic polymer layer chemically combined with the oxide layer or the organic layer.

27 Claims, 12 Drawing Sheets

(52) U.S. Cl.
CPC ......... *H01L 51/0545* (2013.01); *Y10T 428/265* (2015.01); *Y10T 428/3154* (2015.04); *Y10T 428/31663* (2015.04); *Y10T 428/31725* (2015.04); *Y10T 428/31786* (2015.04); *Y10T 428/31935* (2015.04)

(56) References Cited

U.S. PATENT DOCUMENTS

| | | | |
|---|---|---|---|
| 6,369,316 B1* | 4/2002 | Plessing et al. | 136/251 |
| 7,192,650 B2* | 3/2007 | Kobuke et al. | 428/457 |
| 7,199,393 B2* | 4/2007 | Park et al. | 257/40 |
| 2003/0047729 A1* | 3/2003 | Hirai et al. | 257/40 |
| 2004/0185260 A1 | 9/2004 | Luzinov et al. | |
| 2006/0166511 A1* | 7/2006 | Reiba et al. | 438/780 |
| 2006/0169974 A1* | 8/2006 | Ahn et al. | 257/40 |
| 2009/0186490 A1* | 7/2009 | Nakayama et al. | 438/780 |
| 2009/0297868 A1* | 12/2009 | Ito et al. | 428/447 |
| 2011/0083730 A1* | 4/2011 | Fichou et al. | 136/256 |
| 2012/0248425 A1* | 10/2012 | Yang et al. | 257/40 |

OTHER PUBLICATIONS http://en.wikipedia.org/wiki/Methyl.*
http://en.wikipedia.org/wiki/Silsesquioxane.*
Wang, Jingyun. "Hydrophic Sol-gel channel patterning strategies for paper-based microfluidics" Royal Society of Chemistry, Nov. 26, 2013.*
"Silequioxane.", Wikipedia, http://en.wikipedia.org/wiki/silsesquioxane., Mar. 25, 2105.*
International Search Report for PCT application PCT/KR2012/000920 mailed Sep. 28, 2012.

* cited by examiner (a)  (b)

HYBRID LAYER INCLUDING OXIDE LAYER OR ORGANIC LAYER AND ORGANIC POLYMER LAYER AND MANUFACTURING METHOD THEREOF

CROSS-REFERENCE TO RELATED APPLICATIONS

This application is the US National stage, under 35 U.S.C. §371, of International App. No. PCT/KR2012/000920 which was filed on Feb. 8, 2012 and claims priority to Korean Application No. 10-2011-0028454 filed Mar. 29, 2011 and Korean Application No. 10-2012-0002902 filed Jan. 10, 2012.

TECHNICAL FIELD

A hybrid layer is disclosed which an oxide layer or organic layer, and organic polymer layer, an insulating layer including the hybrid layer, and an electronic device such as an organic field-effect transistor.

BACKGROUND ART

An insulator used in an electronic device/material field may have various reactive polarity groups on a surface to act as a charge transfer trap when forming an interface with an organic semiconductor and thus, the surface may be reformed. A scheme of processing a surface of an insulating layer used in a conventional electronic device/material field may include a self-assembly mono layer scheme, a polymer ultra thin film coating scheme, and the like. The self-assembly mono layer scheme may be applied to a semiconductor solution processing, and may provide a hydrophobic surface of an insulating layer, thereby helping enhance a performance of an organic electronic device. However, there may be a degree of difficulty in controlling a manufacturing process and environmental requirements, as well as expectations for a uniform surface characteristic over an entire area. The polymer ultra thin film coating scheme may involve a relatively simple manufacturing process. However, a solvent resistance for an organic solvent may be relatively low and thus, a subsequent solution process may not be performed. To supplement limitations of the polymer ultra thin film coating scheme, a curing agent such as bis(trichlorosilyl)hexane may be used in a macromolecular thin film coating scheme, thereby resulting in an increased surface roughness of an insulating layer.

BRIEF SUMMARY

Technical Goals

To resolve issues described in the foregoing, a hybrid layer is provided having a uniform surface characteristic that may be manufactured by a relatively simple process, and used in various electronic device fields, an insulating layer having the hybrid layer, an organic field-effect transistor having the hybrid layer, and a manufacturing method thereof. The hybrid layer may be applied to an organic electronic device.

Technical Solutions

A hybrid layer is disclosed which includes an oxide layer or an organic layer, and an organic polymer layer chemically combined with the oxide layer or the organic layer.

The oxide layer may correspond to a single layer including an inorganic oxide or a laminated layer of a plurality of layers including an inorganic oxide.

The inorganic oxide may include at least one oxide selected from the group consisting of titanium dioxide ($TiO_2$), silicon dioxide ($SiO_2$), zinc peroxide ($ZnO_2$), indium zinc oxide (InZnO), iron(III) oxide ($Fe_2O_3$), zirconium oxide ($ZrO_2$), aluminum oxide ($Al_2O_3$), vanadium oxide ($V_2O_5$), and niobium pentoxide ($Nb_2O_5$).

The organic layer may include a functional group on a surface, or be capable of inducing a functional group. The functional group may correspond to a saturated or unsaturated hydrocarbon derivative polymer including at least one compound selected from the group consisting of a hydroxyl group, an alkoxy group, a carboxyl group, a halogen group, a silane group, an amine group, a nitro group, an ester group, an aromatic series, a peptide group, an isocyanate group, and sulfur.

An organic polymer of the organic polymer layer may correspond to a hydrophobic or hydrophilic polymer. An organic polymer of the organic polymer layer may be replaced with at least one compound selected from the group consisting of a hydroxyl group, a carboxyl group, a carboxylic acid derivative denoted by —COOR1, —COOCOR1 or —CONR1R2, an amine group, an isocyanate group, and a silane derivative denoted by —SiR1R2R3. Here, R1 through R3 may correspond to one of hydrogen, an alkoxy group, a halogen, and an alkyl group having 1 carbon to 12 carbons respectively.

An organic polymer of the organic polymer layer may include at least one compound selected from the group consisting of polytetrafluoroethylene, polyvinylidenefluoride, polytrichlorofluoroethylene, polyvinylfluoride, a polyolefin-based material, a polysilane-based material, a polyester-based material, a polyfluoro-based material, a polyvinyl chloride-based material, a polyamide-based material, a polyacrylate-based material, a polystyrene-based material, and a copolymer thereof. An organic polymer of the organic polymer layer may have a weight-average molecular weight in a range of 5,000 to 200,000 grams/mole (g/mol).

The organic polymer layer may be provided in a form of a brush. The organic polymer layer may have a thickness in a range of 3 to 20 nanometers (nm). The organic polymer layer may have an organic polymer that reacts with and is chemically combined with at least one compound selected from the group consisting of a hydroxyl group, an amine group, a carboxyl group, an alkoxy group, and an amide group existing on the oxide layer or the organic layer.

The organic polymer layer may correspond to a substrate or an intermediate layer of an electronic device, and the hybrid layer may correspond to a substrate or an intermediate layer of an electronic device.

According to another aspect, there is provided an insulating layer including the hybrid layer, and according to still another aspect, there is provided an organic field-effect transistor including an organic semiconductor and the hybrid layer.

According to yet another aspect, there is provided a method of manufacturing a hybrid layer, the method including applying an organic polymer to an oxide layer or an organic layer, and forming an organic polymer layer by combining the organic polymer with a functional group on the oxide layer or the organic layer through a heat treatment on the oxide layer or the organic layer to which the organic polymer is applied.

The applying may be performed by a drop-casting scheme, a solution spray scheme, an inkjet printing scheme, or a screen printing scheme.

The organic polymer layer may have a thickness in a range of 3 to 20 nm, and the heat treatment may be performed at a temperature in a range of 50° C. to 200° C. and for a period of 1 to 10 hours.

The method may further include introducing at least one compound selected from the group consisting of a hydroxyl group, an amine group, a carboxyl group, an alkoxy group, and an amide group on the oxide layer or the organic layer, and applying optical energy to the oxide layer or the organic layer, before applying the organic polymer.

The method may further include eliminating, through cleaning, a remaining organic polymer failing to combine with the functional group of the oxide layer or the organic layer after the heat treatment.

According to another aspect, there is provided a method of manufacturing an organic field-effect transistor, the method including manufacturing a hybrid layer using the method, and wet or vacuum depositing an organic semiconductor on the hybrid layer.

Effect

According to an aspect, it is possible to obtain, through a relatively simple manufacturing method, an insulating layer that includes an organic polymer layer having an amorphous uniform surface in a form of a brush.

According to an aspect, it is possible to process a surface so that various chemical reactions of an insulating surface may occur by controlling a polymer structure included in an organic polymer layer. Thus, it is possible to reform a surface characteristic, and enhance a solvent resistance, thereby obtaining a material used in various electronic device fields.

BEST MODE FOR CARRYING OUT THE INVENTION

Figure 1:
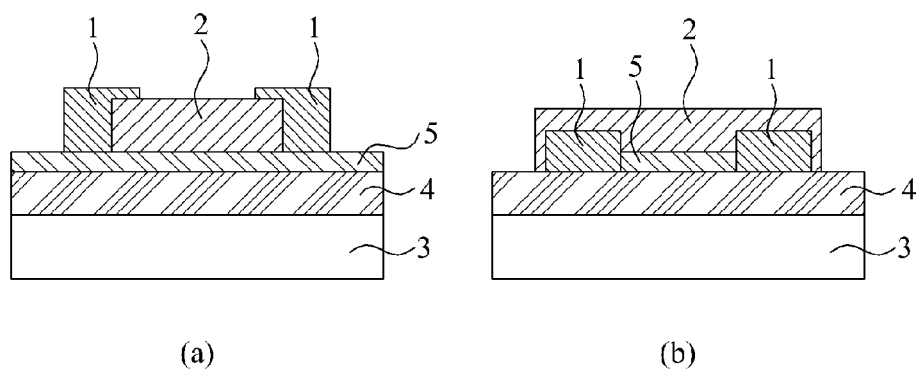
FIG. 1 is a sectional view illustrating an organic field-effect transistor including a hybrid layer.

Reference will now be made in detail to embodiments of the present invention, examples of which are illustrated in the accompanying drawings, wherein like reference numerals refer to the like elements throughout. The embodiments are described below in order to explain the present invention by referring to the figures.

A hybrid layer may include an oxide layer or an organic layer, and an organic polymer layer chemically combined with the oxide layer or the organic layer. As used herein, "chemically combined with" may indicate that one end of an organic polymer is covalently bonded with the oxide layer or the organic layer. The organic polymer may include a portion of inorganic elements.

The oxide layer may correspond to a single layer including an inorganic oxide or a laminated layer of a plurality of layers including an inorganic oxide. The inorganic oxide may include at least one oxide selected from the group consisting of titanium dioxide ($TiO_2$), silicon dioxide ($SiO_2$), zinc peroxide ($ZnO_2$), indium zinc oxide (InZnO), iron(III) oxide ($Fe_2O_3$), zirconium oxide ($ZrO_2$), aluminum oxide ($Al_2O_3$), vanadium oxide ($V_2O_5$), and niobium pentoxide ($Nb_2O_5$). Accordingly, an inorganic oxide single layer or laminated layer-organic polymer hybrid layer may be formed.

The oxide layer may have a thickness in a range of 3 to 10 nanometers (nm) depending on usages.

The organic layer may include a functional group on a surface, or be capable of inducing a functional group, and the functional group may correspond to a saturated or unsaturated hydrocarbon derivative polymer including at least one compound selected from the group consisting of a hydroxyl group, an alkoxy group, a carboxyl group, a halogen group, a silane group, an amine group, a nitro group, an ester group, an aromatic series, a peptide group, an isocyanate group, and sulfur. Accordingly, a hetero-organic hybrid layer combined with an organic polymer on an organic layer may be formed.

That is, a hybrid may refer to a chemical bond between an inorganic oxide and an organic polymer, and may refer to a chemical bond between a surface of an organic layer and an organic polymer.

An organic polymer of the organic polymer layer may correspond to a hydrophobic or hydrophilic polymer. When the organic polymer corresponds to a hydrophobic polymer, a charge transfer trap may be relatively low, and an organic semiconductor thin film may be easily coated on a top of the organic polymer layer.

An organic polymer of the organic polymer layer may be replaced with at least one compound selected from the group consisting of a hydroxyl group, a carboxyl group, a carboxylic acid derivative, an amine group, an isocyanate group, and a silane derivative. In particular, one end of the organic polymer layer may be replaced. R1 through R3 may correspond to one of hydrogen, an alkoxy group, a halogen, and an alkyl group having 1 carbon to 12 carbons respectively, and the carboxylic acid derivative may correspond to —COOR1, —COOCOR1 or —CONR1R2, and the like, and the silane derivate may correspond to —SiR1R2R3.

An organic polymer of the organic polymer layer may correspond to a hydrophobic polymer or a polymer having, as a main chain, a saturated or unsaturated hydrocarbon derivative such as polytetrafluoroethylene, polyvinylidenefluoride, polytrichlorofluoroethylene, polyvinylfluoride, a polyolefin-based material, a polysilane-based material, a polyester-based material, a polyfluoro-based material, a polyvinyl chloride-based material, a polyamide-based material, a polyacrylate-based material, a polystyrene-based material, and a copolymer thereof.

An organic polymer of the organic polymer layer may have a weight-average molecular weight in a range of 5,000 to 200,000 grams/mole (g/mol). A thermal stability may have an issue when the weight-average molecular weight is less than 5,000 g/mol, and an issue of a relatively low permittivity may occur when the weight-average molecular weight exceeds 200,000 g/mol.

The organic polymer layer formed by being chemically combined with the oxide layer or the organic layer on a surface may be provided in a form of a brush. The form of a brush may indicate that one end of a functional group of a polymer is attached to a surface, and an opposite end is in a fluid state, which is similar to a brush. In addition to a case where all organic polymers in an organic polymer layer have one end attached to a surface and an opposite end in a fluid state, a case in which a portion of organic polymers are in a state described in the foregoing, and a portion of organic polymers having both ends attached to a surface may be included.

A polymer brush may have a chemical characteristic easily controlled according to a molecular structure of a polymer chain, and may be replaced with various functional groups and thus, may have a merit in that a surface property of an insulator is easily controlled through reactions with various functional groups on a insulator such as an oxide single layer or a laminated layer insulator, an organic layer polymer insulator, and the like.

The organic polymer layer may have a thickness in a range of 3 to 20 nm. An issue of non-uniformity may occur on a coating thin film (that is, an organic polymer layer) when the thickness of the organic polymer layer is less than 3 nm, and an issue of a relatively low permittivity and thermal stability may occur when the thickness of the organic polymer layer exceeds 20 nm.

The organic polymer layer may have an organic polymer, in particular, one end of the organic polymer that reacts with and is chemically combined with a polar functional group such as a hydroxyl group, an amine group, a carboxyl group, an alkoxy group, and an amide group existing on the oxide layer. Due to a chemical bond, a combined organic polymer may not be separated in an operation of rinsing or cleaning using a solvent, and the like in a solution laminated layer thin film manufacturing process.

The organic polymer layer may correspond to a surface layer or an intermediate layer of an electronic device. When the organic polymer layer corresponds to a surface layer, a hybrid layer may correspond to a hybrid substrate. When the organic polymer layer corresponds to an intermediate layer, a hybrid layer may correspond to a hybrid insulating layer as an intermediate layer of an electronic device.

An insulating layer may include the hybrid layer, and an organic field-effect transistor may include the hybrid layer and an organic semiconductor.

FIG. 1 is a sectional view illustrating an organic field-effect transistor including a hybrid layer. Referring to FIG. 1, (a) illustrates a top electrode, and (b) illustrates a bottom electrode structures. Each of (a) and (b) may have an insulating layer 4 formed on a gate 3, and an organic polymer layer 5 in a form of a brush formed on the insulating layer 4. An electrode 1 and a semiconductor 2 may be formed on the organic polymer layer 5 in a form of a brush.

A hybrid layer of FIG. 1 may correspond to a chemical combination of an oxide layer and an organic polymer layer, or a chemical combination of an organic layer and an organic polymer layer, depending on types of the insulating layer 4.

A method of manufacturing a hybrid layer may include applying an organic polymer to an oxide layer or an organic layer, and forming an organic polymer layer by combining the organic polymer with a functional group on the oxide layer or the organic layer through a heat treatment on the oxide layer or the organic layer to which the organic polymer is applied.

The applying may be performed by a drop-casting scheme, a solution spray scheme, an inkjet printing scheme, or a screen printing scheme.

The organic polymer layer may have a form of a brush described in the foregoing, and the organic polymer layer may have a thickness in a range of 3 to 20 nm. A coating thin film (that is, an organic polymer layer) may be non-uniformly formed when the organic polymer layer is formed to have a thickness less than 3 nm, and may have an issue of a relatively low permittivity and thermal stability when the organic polymer layer is formed to have a thickness exceeding 20 nm.

The organic polymer layer may have an organic polymer that reacts with and is chemically combined with a hydroxyl group, an amine group, a carboxyl group, an alkoxy group, and an amide group, and the like existing on the oxide layer.

The heat treatment may be performed at a temperature in a range of 50° C. to 200° C. and for a period of 1 to 10 hours. An effective chemical bond may not occur when the heat treatment is performed at a temperature less than 50° C., and an organic polymer layer may change when the heat treatment is performed at a temperature higher than 200° C. and for more than 10 hours.

The method may further include cleaning a surface of the oxide layer or the organic layer, introducing a hydroxyl group, an amine group, a carboxyl group, an alkoxy group, an amide group, and the like, and applying optical energy to the oxide layer or the organic layer, before applying the organic polymer in a form of a solution. The applied hydroxyl group, amine group, carboxyl group, alkoxy group, amide group, and the like may allow an organic polymer to be firmly and chemically combined with the oxide layer or the organic layer. The cleaning may be performed using a solvent such as acetone, isopropyl alcohol, and the like, and ultraviolet rays may be used as optical energy. The solvent and optical energy may not be limited thereto.

The method may further include eliminating, through cleaning, a remaining organic polymer failing to combine with the functional group of the oxide layer or the organic layer after the heat treatment. An organic polymer, included in the applied organic polymer, failing to be combined with the oxide layer or the organic layer may be separated in a cleaning operation. An organic polymer chemically combined with the oxide layer may maintain a firm bond through a cleaning using a solvent due to a chemical bond, and a high purity hybrid layer may be obtained.

Accordingly, a hybrid layer may be significantly, physically and chemically stable since the organic polymer layer is strongly chemically combined with the oxide layer or the organic layer, and may be used as an insulator or an insulating layer of an organic semiconductor due to an environmentally friendly hydrophobic surface characteristic and a relatively low surface roughness. In particular, since an organic polymer layer may not be eliminated through cleaning using an organic solvent when compared to a conventional inorganic oxide substrate coated with a polymer, an operation using a wet solution process such as a drop-casting scheme, a solution spray scheme, an inkjet printing scheme, a screen printing scheme, and the like in addition to an operation for depositing, using a vacuum deposition scheme, an organic semiconductor on a hybrid layer, in particular, when the hybrid layer corresponds to a hybrid substrate, may be used.

A method of manufacturing an organic field-effect transistor may include manufacturing a hybrid layer using a scheme described in the foregoing, and wet or vacuum depositing an organic semiconductor on the hybrid layer.

Hereinafter, the hybrid layer will be described with reference to the following examples. However, it should be understood that the claimed invention is not limited to the illustrated examples.

Example 1

Manufacture of Insulating Substrate (1)

Figure 2:
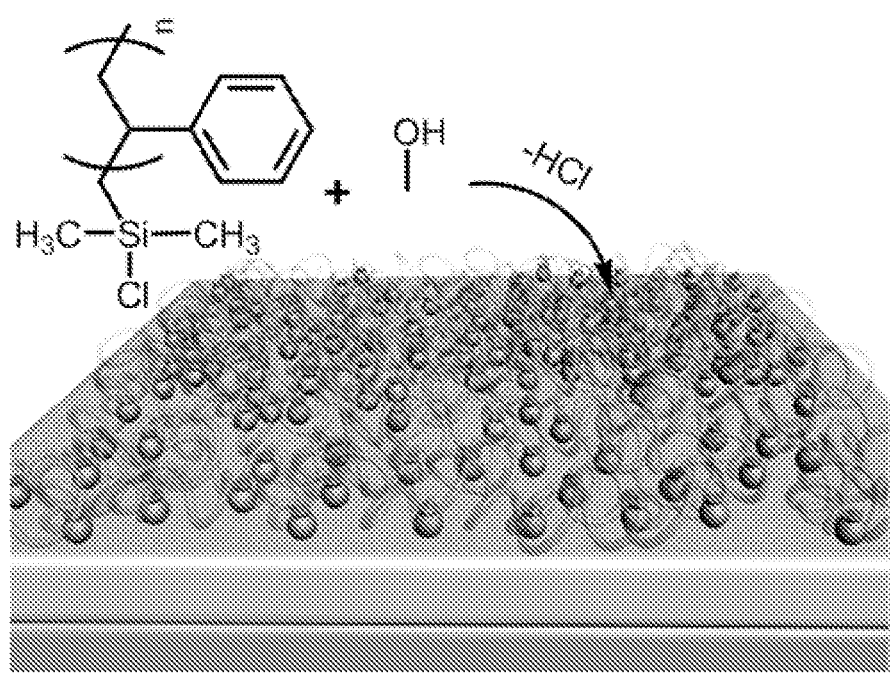
FIG. 2 is conceptual diagram illustrating a chemical combining process on a hybrid substrate of Example 1.

In Example 1, an insulating substrate including, as an insulating layer, a hybrid layer may be manufactured. FIG. 2 is conceptual diagram illustrating a chemical combining process on a hybrid substrate of Example 1. A base inorganic oxide layer may be formed on a silicon substrate to use a $SiO_2$ thin film having a thickness of about 300 nm. The silicon substrate may be cleaned using acetone, and then exposed to ultraviolet rays.

A solution may be manufactured by dissolving, in a toluene solvent of 1 ml, dimethylchlorosilane-terminated polystyrene (PS—Si(CH3)2Cl, having a weight-average molecular weight of about 8,000 g/mol) of about 4 milligrams (mg) that is to be used as an organic polymer. Dimethylchlorosilane-terminated polystyrene corresponding to a functional group may be coated, using a spin-casting scheme, on a SiO2 substrate to have a thickness of about 20 nm, and may be heat-treated at a temperature of about 110° C. for about 60 minutes. The SiO2 substrate may be cleaned using toluene to eliminate dimethylchlorosilane-terminated polystyrene that fails to react, and ultrasonic waves may be applied to the SiO2 substrate for about three minutes.

Figure 3:
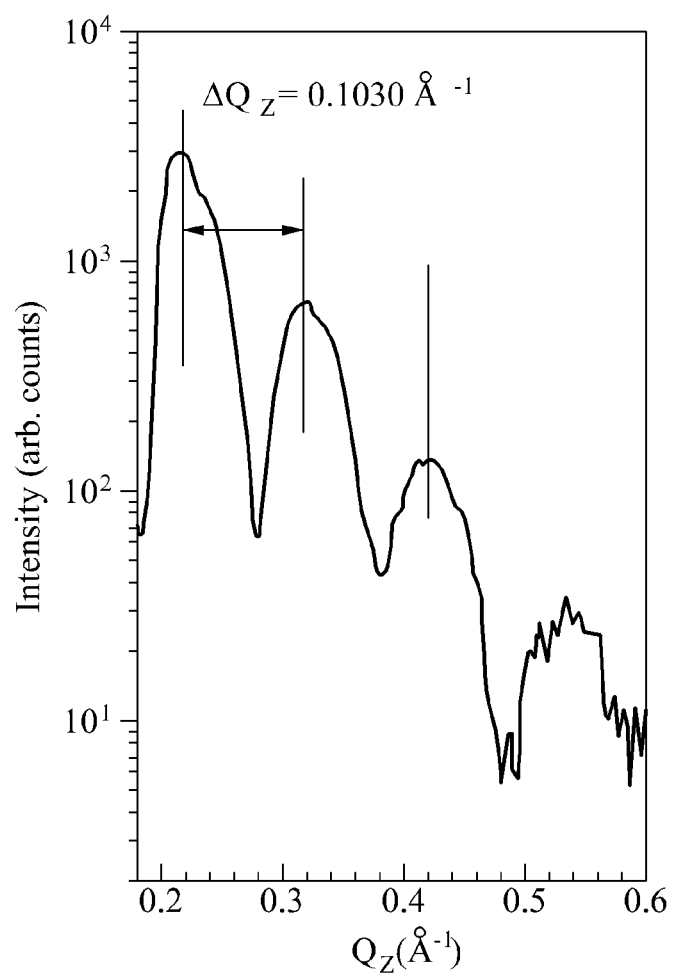
FIG. 3 is a diagram illustrating a result of X-ray reflectivity (XRR) analysis for an oxide-organic polymer hybrid substrate of Example 1.

After cleaning the $SiO_2$ substrate using toluene, it may be verified, through an X-ray reflectivity (XRR) scheme, that a functional group-substituted polystyrene brush layer is combined with a silicon oxide layer in a thickness of 6 nm (layer thickness=2π/ΔQz). FIG. 3 is a diagram illustrating a result of analyzing, using an XRR, an oxide-organic polymer hybrid substrate of Example 1.

Figure 4:
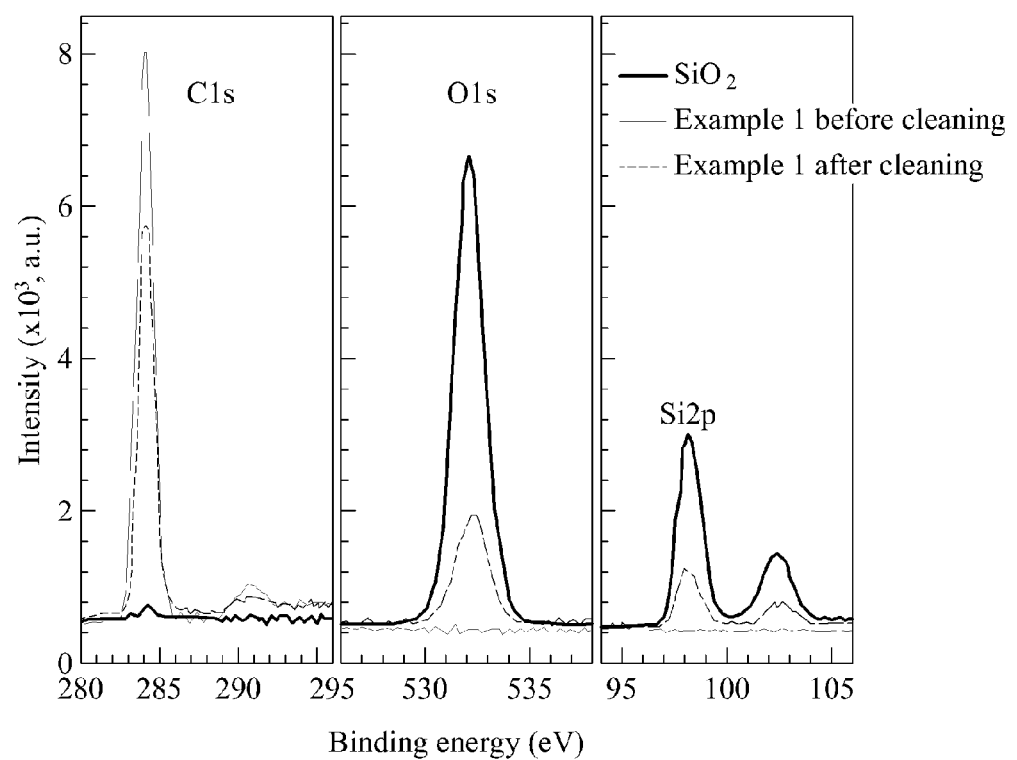
FIG. 4 is a diagram illustrating a result of X-ray photoelectron spectroscopy (XPS) analysis for an oxide-organic polymer hybrid substrate manufactured in Example 1.

FIG. 4 is a diagram illustrating a result of analyzing, using an X-ray photoelectron spectroscopy (XPS), an oxide-organic polymer hybrid substrate manufactured in Example 1. FIG. 4 illustrates a result of analyzing, using an XPS, a non-processed silicon oxide substrate and a functional group-substituted polystyrene brush-silicon oxide hybrid substrate before and after being cleaned using toluene. A hybrid substrate before being cleaned using toluene is indicated by a dotted line, a hybrid substrate after being cleaned using toluene is indicated by a thin line, and a silicon oxide SiO2 substrate not undergoing a polystyrene process is indicated by thick line.

The XPS result of FIG. 4 illustrates that an intensity of C1, detected from functional group-substituted polystyrene corresponding to an organic polymer layer in a hybrid substrate before and after being cleaned using toluene, may not vary significantly.

Example 2

Manufacture of Insulating Substrate (2)

Other than AlOx corresponding to aluminum oxide having a thickness of about 50 nm being used as an inorganic oxide layer on a polycarbonate substrate, a hybrid insulating substrate is manufactured through the same scheme as Example 1.

Example 3

Manufacture of Intermediate Layer

Figure 5:
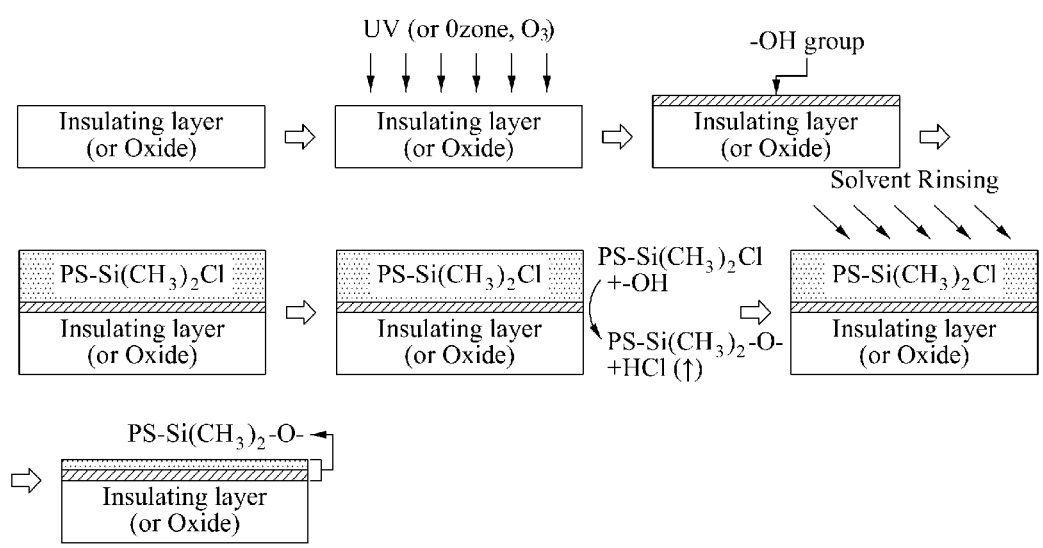
FIG. 5 is a diagram illustrating a process of manufacturing an oxide-organic polymer and organic-organic polymer hybrid layer of Example 3.

A solution of about 10 weight percent (wt %) is manufactured by dissolving poly(4-vinylphenol) (PVP, having a weight-average molecular weight of about 25,000 g/mol) in a propylene glycol methyl ether acetate (PGMEA) solvent. The PVP solution may be coated on a polyethyleneterephtalate (PET) substrate through an inkjet printing scheme to manufacture an organic insulating layer, and the organic insulating layer may be exposed to ultraviolet rays for about 10 minutes to form, on a surface, a hydroxyl group corresponding to a chemical reactor. A solution may be manufactured by dissolving, in a toluene solvent of 1 milliliter (ml), dimethylchlorosilane-terminated polystyrene (having a weight-average molecular weight of about 8,000 g/mol) of about 4 mg. Functional group-substituted polystyrene may be coated on a PVP insulating layer using a drop-casting scheme, and a heat-treatment may be performed at a temperature of about 110° C. for about 60 minutes. The PVP insulating layer may be cleaned using toluene to eliminate functional group-substituted polystyrene that fails to react, and ultrasonic waves may be applied to the PVP insulating layer for about three minutes. A process described in the foregoing is illustrated in FIG. 5.

Example 4

Manufacture of Organic Field-Effect Transistor (1)

Pentacene (manufactured by Aldrich) may be deposited, using a vapor deposition scheme, on a hybrid insulating layer substrate manufactured in Example 1 to have a thickness of about 50 nm. In this instance, a deposition rate may be controlled to be 0.1 angstroms/second (□/s), a degree of vacuum may be controlled to be 10-6 Torr, a substrate temperature may be controlled to be 25° C. Finally, a gold (Au) top electrode may be formed through a thermal evaporation deposition to manufacture a Pentacene organic field-effect transistor. A channel length (L) and a width (W) may correspond to 100 micrometers (μm) and 1500 μm, respectively.

Example 5

Manufacture of Organic Field-Effect Transistor (2)

N,N'-ditridecyl-3,4,9,10-perylene tetracarboxylic diimide (PTCDI-C13, manufactured by Aldrich) may be deposited, using a vapor deposition scheme, on a substrate manufactured in Example 1 to have a thickness of about 50 nm. In this instance, a deposition rate may be controlled to be 0.1 Å/s, a degree of vacuum may be controlled to be 10-6 Torr, a substrate temperature may be controlled to be 25° C. Finally, an aluminum (Al) top electrode may be formed through a thermal evaporation deposition to manufacture a PTCDI-C13 organic field-effect transistor. A channel length (L) and a width (W) may correspond to 100 micrometers (μm) and 1,500 μm, respectively.

Example 6

Manufacture of Organic Field-Effect Transistor (3)

Triethylsilylethynyl anthradithiophene (TES-ADT, synthesized) may be coated, by a spin-casting scheme, on a substrate manufactured in Example 1. Thereafter, a post-processing may be performed in a dichloroethane atmosphere at a room temperature for about 20 minutes, and then an Au electrode may be formed through a thermal evaporation deposition to manufacture a TES-ADT organic field-effect transistor. A channel length (L) and a width (W) may correspond to 100 μm and 1,500 μm, respectively.

Example 7

Manufacture of Organic Field-Effect Transistor (4)

Poly(3-hexylthiophene) (P3HT, manufactured by BASF) may be coated, by a spin-casting scheme, on a substrate manufactured in Example 1. Thereafter, a heat treatment may be performed at a temperature of 120° C. for about 2 hours, and then an Au electrode may be formed through a thermal evaporation deposition to manufacture a P3HT organic field-effect transistor. A channel length (L) and a width (W) may correspond to 100 μm and 1,500 μm, respectively.

Example 8

Manufacture of Thin Film Transistor

Figure 6:
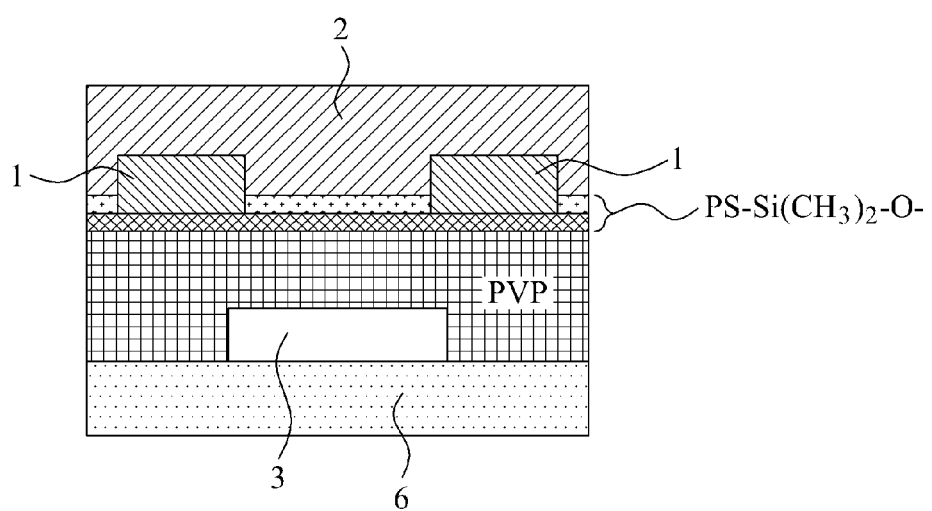
FIG. 6 is a diagram illustrating a field-effect transistor of Example 8.

After manufacturing a hybrid insulating layer of Example 3, a solution manufactured by dissolving, in a toluene 1 ml solvent, TIPS-PEN (6,13-bis(triisopropylsilylethynyl)pentacene) of 10 mg corresponding to an organic semiconductor may be coated, using a drop-casting scheme, on a PVP insulating layer processed by dimethylchlorosilane-terminated polystyrene (PS—Si(CH$_3$)$_2$Cl, having a weight-average molecular weight of about 8,000 g/mol). A gate, a source electrode, and a drain electrode may be manufactured through an inkjet printing scheme using a silver (Ag) dispersion solution, thereby manufacturing a field-effect transistor having a structure of FIG. 6 in which a gate 3 and a PVP layer are formed on a PET substrate 6, and an electrode 1 and a semiconductor 2 are formed on a hybrid layer.

Comparative Example 1

Silicon oxide SiO$_2$ having a thickness of 300 nm may be used as an inorganic oxide layer. A substrate may be cleaned using acetone, and may be exposed to ultraviolet rays. A solution may be manufactured by dissolving, in a toluene solvent of 1 ml, an unsubstituted polystyrene (having a weight-average molecular weight of about 8,000 g/mol) of 4 mg. The corresponding polystyrene solution may be coated, using a spin-casting scheme, on a SiO$_2$ substrate to be a film having a thickness of about 20 nm, and then may be heat-treated at about 110° C. for about 60 minutes.

Comparative Example 2

SiO$_2$ having a thickness of 300 nm may be used as an inorganic oxide layer. A substrate may be cleaned using acetone, and may be exposed to ultraviolet rays. A SiO$_2$ substrate processed by a hexamethylenedisilazane self-assembled mono layer may be heat-treated at about 110° C. for about 60 minutes. To preclude a failure of hexamethylenedisilazane reacting, the SiO$_2$ substrate may be cleaned using toluene, or ultrasonic waves may be applied for about three minutes, after dipping the SiO$_2$ substrate in a toluene solution.

Comparative Example 3

SiO$_2$ having a thickness of 300 nm corresponding to an inorganic oxide layer used in Comparative examples 1 and 2 may not be processed after being cleaned using acetone, and may be used as a single insulating layer for manufacturing an organic field-effect transistor in the same process as Examples 4 through 7.

Hereinafter, Examples and Comparative examples are comparative analyzed through each evaluation.

1. Evaluation for Hydrophobicity

Hydrophobicity may be evaluated for Example 1, Comparative examples 1 and 2, and a non-processed SiO$_2$ substrate after being cleaned using acetone (which corresponds to Comparative example 3) by dropping a water drop on the corresponding substrate and measuring a water contact angle. In this instance, measurements for Example 1 and Comparative example 1 may be divided into cases of before being cleaned using toluene and of after being cleaned using toluene to evaluate a solvent resistance of a top organic polymer layer. Measurement results are shown in the following Table 1.

TABLE 1

| | non-processed SiO$_2$ | Example 1 | | Comparative example 1 | | Comparative example 2 |
| --- | --- | --- | --- | --- | --- | --- |
| | | before cleaning | after cleaning | before cleaning | after cleaning | |
| water contact angle | 0° | 90° | 90° | 90° | 31° | 64° |

Figure 7:
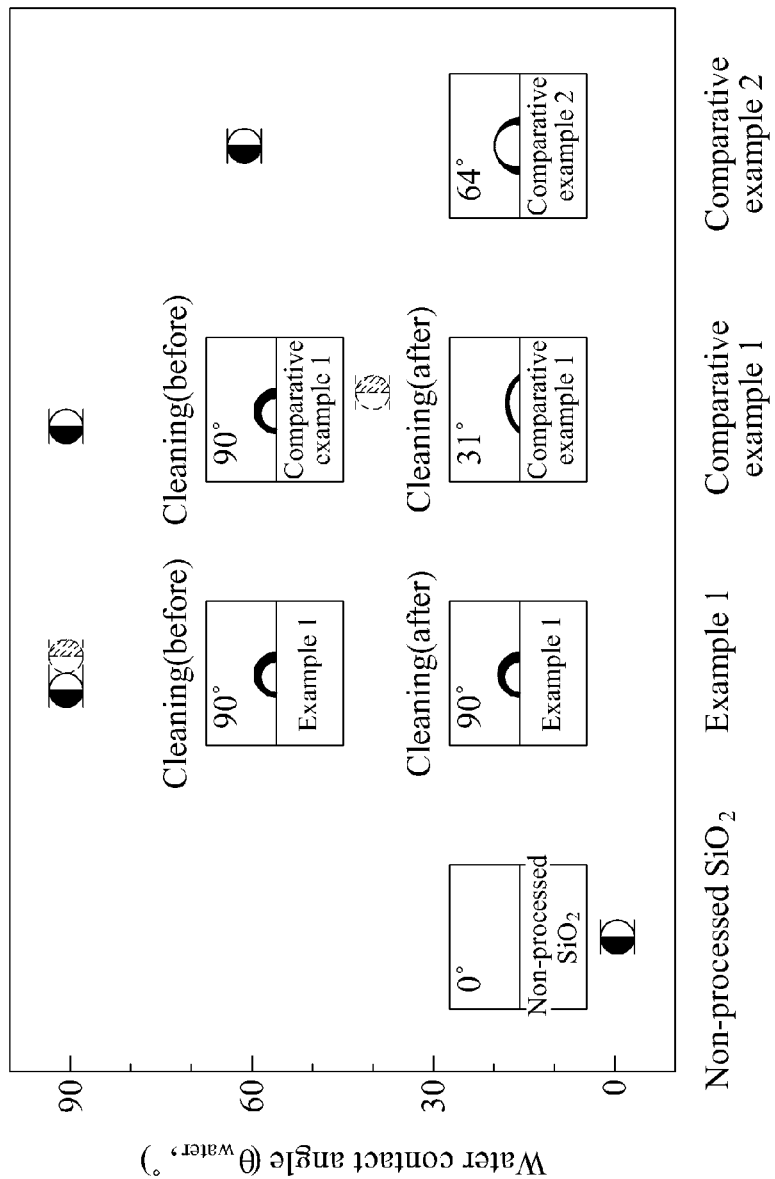
FIG. 7 is a diagram illustrating a result of measuring a water contact angle of an insulating layer substrate of Example 1 manufactured according to the methods disclosed below, and Comparative examples 1 through 3 manufactured according to a related art.

Referring to Table 1 and FIG. 7, a hybrid layer of Example 1 may not have a difference in hydrophobicity with regard to a case of before being cleaned using toluene and a case of after being cleaned using toluene. However, Comparative example 1 may have hydrophobicity before being cleaned, and may have a rapidly decreased hydrophobicity after being cleaned since a polystyrene film layer is eliminated by a toluene solvent, which indicates that a polystyrene coating may be vulnerable to an organic solvent.

2. Evaluation for Surface Roughness

Figure 8:
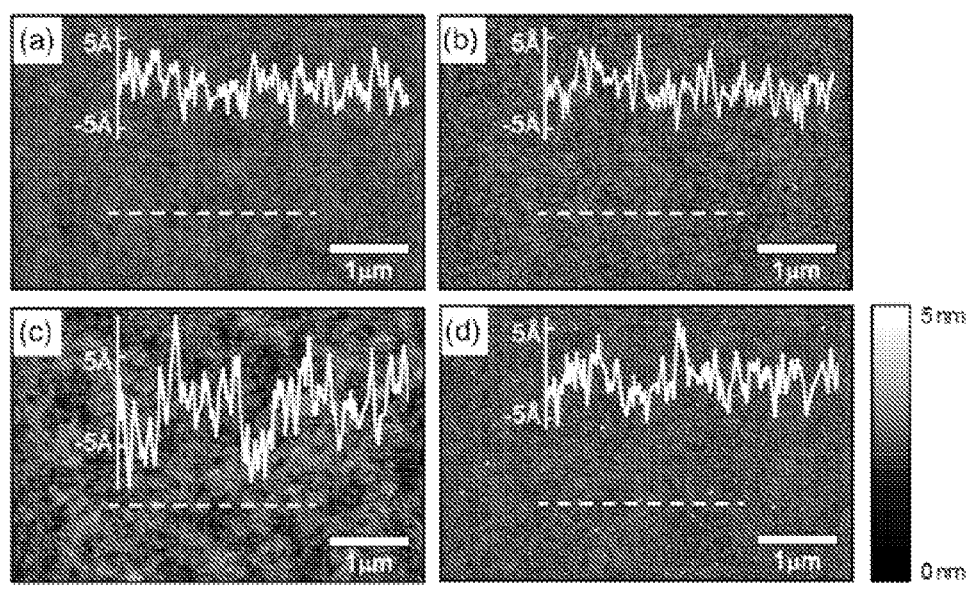
FIG. 8 is a diagram illustrating a result of atomic force microscopy analysis for an insulating layer substrate of Example 1 manufactured according to the methods disclosed below, and Comparative examples 1 through 3 manufactured according to a related art.

Surface roughness may be measured using an atomic force microscope for a non-processed silicon oxide SiO$_2$ layer, Example 1, Comparative example 1 (before being cleaned using toluene), and Comparative example 2. FIG. 8 is a diagram illustrating a result of analyzing, using the atomic force microscope, an insulating layer substrate manufactured by the non-processed SiO$_2$ (a), Example 1 (b), Comparative example 1 (c), and Comparative example 2 (d), respectively. It may be verified that a surface roughness (root mean square, R$_q$) of Example 1 corresponds to 0.44 nm, which may be similar to a surface roughness 0.40 nm of a non-processed SiO$_2$ substrate and a surface roughness 0.43 nm of a substrate of Comparative example 1.

3. Evaluation for Performance of Organic Field-Effect Transistor [1]

Figure 9:
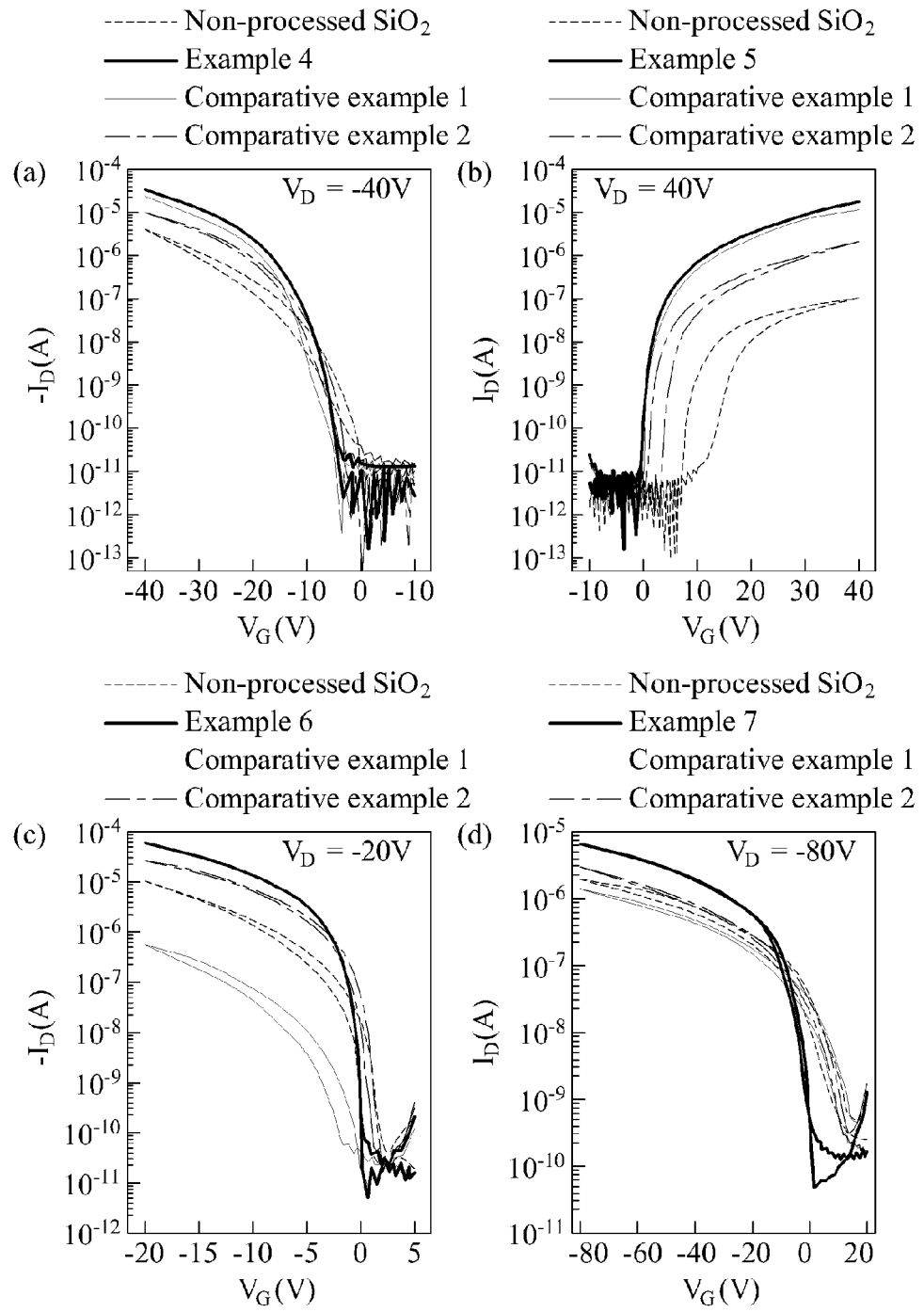
FIG. 9 is a diagram illustrating ID-VG transfer curve graphs of an organic field-effect transistor of Examples 4 through 7.
Figure 10:
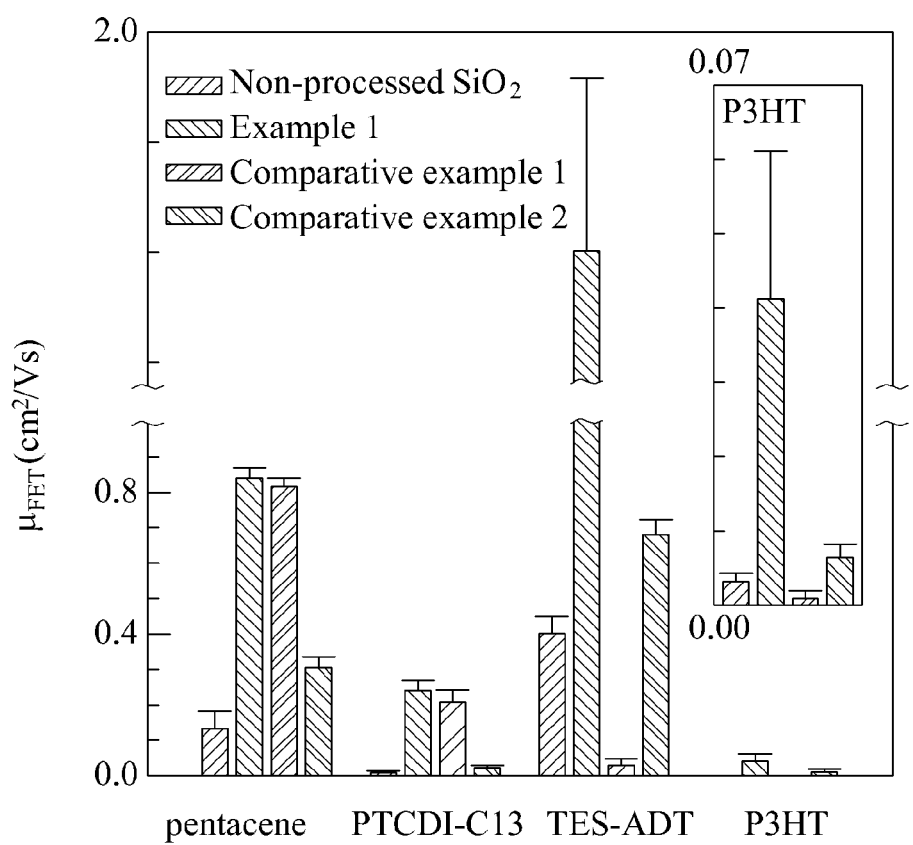
FIG. 10 is a graph illustrating a result of analyzing a charge mobility (μFET) of an organic field-effect transistor of Examples 4 through 7.

A performance of an organic field-effect transistor including an insulating layer that is manufactured in Examples 4 through 7, and Comparative examples 1 through 3 may be measured, and shown in Table 2, FIG. 9, and FIG. 10. FIG. 9 is a diagram illustrating $I_D$-$V_G$ transfer curve graphs of an organic field-effect transistor to which an insulating layer manufactured in Examples 4 through 7, and Comparative examples 1 through 3 is applied (Pentacene (a), PTCDI-C13 (b), TES-ADT (c), P3HT (d) organic semiconductor and hybrid and Comparative examples 1 and 2, non-processed $SiO_2$ (Comparative example 3)), and FIG. 10 is a graph illustrating a result of analyzing a charge mobility ($\mu_{FET}$) of an organic field-effect transistor including an insulating layer that is manufactured in Examples 4 through 7, and Comparative examples 1 through 3.

A charge mobility ($\mu_{FET}$) of FIG. 10 may be obtained from the $I_D$-$V_G$ transfer curve of FIG. 9 based on Equation 1.

$$I_D = \frac{WC_i}{2L}\mu_{FET}(V_G - V_o)^2 \quad \text{[Equation 1]}$$

$$C_i = 10 \text{ nF/cm}^2$$

A threshold voltage ($V_O$) may be obtained from a voltage at a point where a tangent line of a measured transfer curve intersects a $V_G$ axis. A current ratio ($I_{on}/I_{off}$) may be obtained from a maximum/minimum current value of a measurement element.

TABLE 2

| semi-conductor | insulator | charge mobility $\mu_{FET}$ [cm$^2$V$^{-1}$s$^{-1}$] | threshold voltage $V_O$ [V] | current on/off ratio $I_{on}/I_{off}$ |
|---|---|---|---|---|
| Penta-cene | non-processed SiO$_2$ substrate | 0.13 ± 0.05 | −17.1 ± 2.2 | ~10$^6$ |
| | Example 1 | 0.84 ± 0.03 | −11.6 ± 1.2 | ~10$^7$ |
| | Comparative example 1 | 0.82 ± 0.02 | −11.9 ± 1.1 | ~10$^7$ |
| | Comparative example 2 | 0.30 ± 0.04 | −14.6 ± 1.7 | ~10$^6$ |
| PTCDI-C13 | non-processed SiO$_2$ substrate | 0.005 ± 0.007 | 8.7 ± 1.3 | ~5 × 10$^4$ |
| | Example 1 | 0.24 ± 0.03 | 2.3 ± 1.2 | ~10$^7$ |
| | Comparative example 1 | 0.21 ± 0.03 | 2.1 ± 0.9 | ~10$^7$ |
| | Comparative example 2 | 0.021 ± 0.004 | 3.6 ± 1.6 | ~10$^6$ |
| TES-ADT | non-processed SiO$_2$ substrate | 0.40 ± 0.05 | −3.6 ± 1.1 | ~5 × 10$^5$ |
| | Example 1 | 1.75 ± 0.20 | −1.5 ± 0.8 | ~10$^7$ |
| | Comparative example 1 | 0.031 ± 0.02 | −4.8 ± 1.7 | ~5 × 10$^4$ |
| | Comparative example 2 | 0.68 ± 0.04 | −2.3 ± 1.2 | ~10$^6$ |
| P3HT | non-processed SiO$_2$ substrate | 0.003 ± 0.001 | 12.4 ± 2.5 | ~10$^3$ |
| | Example 1 | 0.041 ± 0.02 | 3.8 ± 2.1 | ~10$^5$ |
| | Comparative example 1 | 0.001 ± 0.0008 | 13.8 ± 2.2 | ~10$^3$ |
| | Comparative example 2 | 0.006 ± 0.002 | 9.8 ± 2.0 | ~10$^4$ |

Referring to Table 2 and FIG. 10, in a case of Pentacene and a PTCDI-C13 organic field-effect transistor processed by a vacuum deposition, Example 1 may have a similar or excellent organic semiconductor element performance when compared to Comparative example 1, and in a case of a laminated layer organic semiconductor solution printing operation such as a spin-casting scheme, a TES-ADT and P3HT organic field-effect transistor to which Example 1 is applied may have an excellent performance when compared to Comparative example 1 in which a polymer layer on top of an insulating layer may be delaminated by an organic solvent.

4. Evaluation for Performance of Organic Field-Effect Transistor [2]

Figure 11:
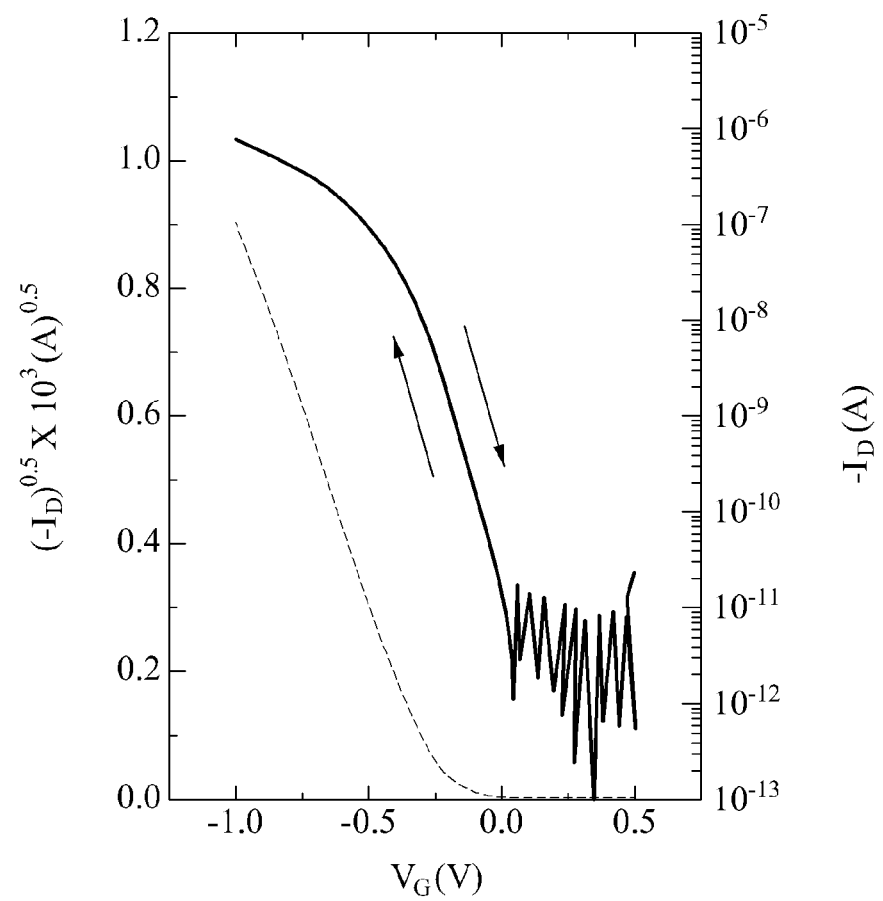
FIG. 11 is an ID-VG transfer curve graph of a TES-ADT organic field-effect transistor element including a hybrid insulating layer substrate of Example 2.

A measured element performance of a TES-ADT organic field-effect transistor to which a hybrid insulating layer is applied on a polycarbonate flexible substrate used in Example 2 is illustrated in FIG. 11 and Table 3. FIG. 11 illustrates a result of analyzing an $I_D$-$V_G$ transfer curve graph of a TES-ADT organic field-effect transistor to which a hybrid insulating layer is applied on a polycarbonate flexible substrate manufactured in Example 2. Referring to Table 3 and FIG. 11, a TES-ADT organic field-effect transistor manufactured, in a spin-casting organic semiconductor solution film process, on a hybrid insulating layer that is manufactured through Example 2 may have a significantly excellent charge mobility, threshold voltage, and current on/off ratio when operates in an ultra-low power less than or equal to 1 volt (V).

TABLE 3

| semi-conductor | insulator | charge mobility $\mu_{FET}$ [cm$^2$V$^{-1}$s$^{-1}$] | threshold voltage $V_O$ [V] | current on/off ratio $I_{on}/I_{off}$ |
|---|---|---|---|---|
| TES-ADT | Example 2 | 1.26 | −0.24 | >10$^6$ |

5. Evaluation for Performance of Organic Field-Effect Transistor [3]

Figure 12:
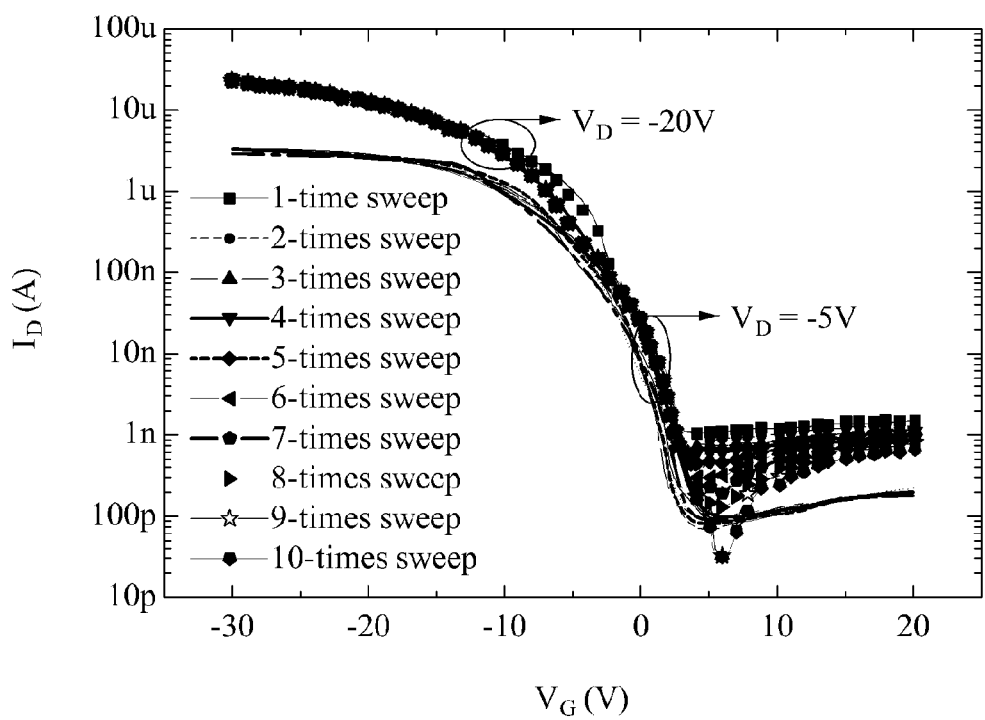
FIG. 12 is an ID-VG transfer curve graph of a TIPS-PEN organic field-effect transistor element including a hybrid insulating layer substrate of Example 8.

A performance of a TIPS-PEN organic field-effect transistor manufactured in Example 8 may be measured, and shown in FIG. 12 and Table 4. FIG. 12 is an $I_D$-$V_G$ transfer curve graph of a TIPS-PEN organic field-effect transistor manufactured in Example 8. Referring to Table 4 and FIG. 12, a drop-casting TIPS-PEN organic field-effect transistor element using Example 8 may have a remarkably excellent performance.

TABLE 4

| semi-conductor | insulator | charge mobility $\mu_{FET}$ [cm$^2$V$^{-1}$s$^{-1}$] | threshold voltage $V_O$ [V] | current on/off ratio $I_{on}/I_{off}$ |
|---|---|---|---|---|
| TIPS-PEN | Example 3 | 0.15 | −1.98 | 2 × 10$^5$ |

Although a few embodiments have been shown and described, the claimed invention is not limited to the described embodiments. Instead, it would be appreciated by those skilled in the art that changes may be made to these embodiments without departing from the principles and spirit of the invention, the scope of which is defined by the claims and their equivalents.

It is to be understood that both the foregoing general description and the following detailed description are exemplary and explanatory and are intended to provide further explanation of the invention as claimed.

The invention claimed is:

1. An organic semiconductor device, comprising:
a gate electrode;
an oxide layer or an organic layer disposed on the gate electrode;

an organic polymer layer chemically combined with the oxide layer or the organic layer; and an organic semiconductor layer disposed on the organic polymer layer, wherein the oxide layer or the organic layer is an insulating intermediate between the gate electrode and the organic semiconductor layer, wherein the organic layer comprises a functional group on a surface, or is capable of inducing a functional group, and wherein the organic polymer layer comprises a polymer of which one end of a functional group of the polymer is attached to a surface of the organic polymer and an opposite end of the polymer is in a fluid state.

2. The organic semiconductor device of claim 1, wherein the oxide layer corresponds to a single layer comprising an inorganic oxide or a laminated layer of a plurality of layers comprising an inorganic oxide.

3. The organic semiconductor device of claim 2, wherein the inorganic oxide comprises at least one oxide selected from the group consisting of titanium dioxide ($TiO_2$), silicon dioxide ($SiO_2$), zinc peroxide ($ZnO_2$), indium zinc oxide (InZnO), iron(III) oxide ($Fe_2O_3$), zirconium oxide ($ZrO_2$), aluminum oxide ($Al_2O_3$), vanadium oxide ($V_2O_5$), and niobium pentoxide ($Nb_2O_5$).

4. The organic semiconductor device of claim 1, wherein the functional group corresponds to a saturated or unsaturated hydrocarbon derivative polymer comprising at least one compound selected from the group consisting of a hydroxyl group, an alkoxy group, a carboxyl group, a halogen group, a silane group, an amine group, a nitro group, an ester group, an aromatic series, a peptide group, an isocyanate group, and sulfur.

5. The organic semiconductor device of claim 1, wherein an organic polymer of the organic polymer layer corresponds to a hydrophobic or hydrophilic polymer.

6. The organic semiconductor device of claim 1, wherein an organic polymer of the organic polymer layer is replaced with at least one compound selected from the group consisting of a hydroxyl group, a carboxyl group, a carboxylic acid derivative denoted by —$COOR_1$, —$COOCOR_1$ or —$CONR_1R_2$, an amine group, an isocyanate group, and a silane derivate denoted by —$SiR_1R_2R_3$, $R_1$ through $R_3$ corresponding to one of hydrogen, an alkoxy group, a halogen, and an alkyl group having 1 carbon to 12 carbons respectively.

7. The organic semiconductor device of claim 1, wherein an organic polymer of the organic polymer layer comprises at least one compound selected from the group consisting of polytetrafluoroethylene, polyvinylidenefluoride, polytrichlorofluoroethylene, polyvinylfluoride, a polyolefin-based material, a polysilane-based material, a polyester-based material, a polyfluoro-based material, a polyvinyl chloride-based material, a polyamide-based material, a polyacrylate-based material, a polystyrene-based material, and a copolymer thereof.

8. The organic semiconductor device of claim 1, wherein an organic polymer of the organic polymer layer has a weight-average molecular weight in a range of 5,000 to 200,000 grams/mole (g/mol).

9. The organic semiconductor device of claim 1, wherein the organic polymer layer has a thickness in a range of 3 to 20 nanometers (nm).

10. The organic semiconductor device of claim 1, wherein the organic polymer layer has an organic polymer that reacts with and is chemically combined with at least one compound selected from the group consisting of a hydroxyl group, an amine group, a carboxyl group, an alkoxy group, and an amide group existing on the oxide layer or the organic layer.

11. The organic semiconductor device of claim 1, wherein the organic polymer layer corresponds to a substrate or an intermediate layer of an electronic device.

12. The organic semiconductor device of claim 1, wherein the hybrid layer corresponds to a substrate or an intermediate layer of an electronic device.

13. A method of manufacturing an organic semiconductor device, the method comprising:

forming a gate electrode;

disposing an oxide layer or an organic layer on the gate electrode, applying an organic polymer to the oxide layer or the organic layer;

forming an organic polymer layer by chemically combining the organic polymer with a functional group on the oxide layer or the organic layer through a heat treatment on the oxide layer or the organic layer to which the organic polymer is applied; and disposing an organic semiconductor layer on the organic polymer layer, wherein the oxide layer or the organic layer is an insulating intermediate between the gate electrode and the organic semiconductor layer, wherein the organic layer comprises a functional group on a surface, or is capable of inducing a functional group, and wherein the functional group corresponds to a saturated or unsaturated hydrocarbon derivative polymer comprising at least one compound selected from the group consisting of a hydroxyl group, an alkoxy group, a carboxyl group, a halogen group, a silane group, an amine group, a nitro group, an ester group, an aromatic series, a peptide group, an isocyanate group, and sulfur.

14. The method of claim 13, wherein the oxide layer corresponds to a single layer comprising an inorganic oxide or a laminated layer of a plurality of layers comprising an inorganic oxide.

15. The method of claim 14, wherein the inorganic oxide comprises at least one oxide selected from the group consisting of titanium dioxide ($TiO_2$), silicon dioxide ($SiO_2$), zinc peroxide ($ZnO_2$), indium zinc oxide (InZnO), iron(III) oxide ($Fe_2O_3$), zirconium oxide ($ZrO_2$), aluminum oxide ($Al_2O_3$), vanadium oxide ($V_2O_5$), and niobium pentoxide ($Nb_2O_5$).

16. The method of claim 13, wherein an organic polymer of the organic polymer layer corresponds to a hydrophobic or hydrophilic polymer.

17. The method of claim 13, wherein an organic polymer of the organic polymer layer is replaced with at least one compound selected from the group consisting of a hydroxyl group, a carboxyl group, a carboxylic acid derivative denoted by —$COOR_1$, —$COOCOR_1$ or —$CONR_1R_2$, an amine group, an isocyanate group, and a silane derivate denoted by —$SiR_1R_2R_3$, $R_1$ through $R_3$ corresponding to one of hydrogen, an alkoxy group, a halogen, and an alkyl group having 1 carbon to 12 carbons respectively.

18. The method of claim 13, wherein an organic polymer of the organic polymer layer comprises at least one compound selected from the group consisting of polytetrafluoroethylene, polyvinylidenefluoride, polytrichlorofluoroethylene, polyvinylfluoride, a polyolefin-based material, a polysilane-based material, a polyester-based material, a polyfluoro-based material, a polyvinyl chloride-based material, a polyamide-based material, a polyacrylate-based material, a polystyrene-based material, and a copolymer thereof.

19. The method of claim 13, wherein an organic polymer of the organic polymer layer has a weight-average molecular weight in a range of 5,000 to 200,000 grams/mole (g/mol).

20. The method of claim 13, wherein the applying step is performed by a drop-casting scheme, a solution spray scheme, an inkjet printing scheme, or a screen printing scheme.

21. The method of claim 13, wherein the organic polymer layer comprises a polymer of which one end of a functional group of the polymer is attached to a surface of the organic polymer and an opposite end of the polymer is in a fluid state.

22. The method of claim 13, wherein the organic polymer layer has a thickness in a range of 3 to 20 nanometers (nm).

23. The method of claim 13, wherein the organic polymer layer has an organic polymer that reacts with and is chemically combined with at least one compound selected from the group consisting of a hydroxyl group, an amine group, a carboxyl group, an alkoxy group, and an amide group existing on the oxide layer or the organic layer.

24. The method of claim 13, wherein the heat treatment is performed at a temperature in a range of 50° C. to 200° C. and for a period 1 to 10 hours.

25. The method of claim 13, further comprising:
introducing at least one compound selected from the group consisting of a hydroxyl group, an amine group, a carboxyl group, an alkoxy group, and an amide group on the oxide layer or the organic layer, and applying optical energy to the oxide layer or the organic layer, before applying the organic polymer.

26. The method of claim 13, further comprising:
eliminating, through cleaning, a remaining organic polymer failing to combine with the functional group of the oxide layer or the organic layer after the heat treatment.

27. The method of claim 13, wherein disposing the organic semiconductor layer comprises wet or vacuum depositing the organic semiconductor on the organic polymer layer.

* * * * *